United States Patent [19]

Larsen et al.

[11] Patent Number: 5,077,738

[45] Date of Patent: Dec. 31, 1991

[54] TEST MODE ENABLE SCHEME FOR MEMORY

[75] Inventors: Robert E. Larsen, Shingle Springs; Khandker N. Quader, Citrus Heights; Joseph H. Salmon, Placerville, all of Calif.

[73] Assignee: Intel Corporation, Santa Clara, Calif.

[21] Appl. No.: 707,241

[22] Filed: May 22, 1991

Related U.S. Application Data

[63] Continuation of Ser. No. 292,366, Dec. 30, 1988, abandoned.

[51] Int. Cl.$^5$ .................... G01R 31/28; G01R 31/30; G11C 29/00
[52] U.S. Cl. .................................. 371/15.1; 371/21.1; 371/21.4
[58] Field of Search ............... 371/22.1, 22.2, 22.3, 371/22.4, 22.6, 21.1, 21.2, 15.1, 16.1; 365/200, 201

[56] References Cited

U.S. PATENT DOCUMENTS

| | | | |
|---|---|---|---|
| 4,689,740 | 8/1987 | Moelands et al. | 364/200 |
| 4,701,920 | 10/1987 | Resnick et al. | 371/22.5 |
| 4,710,933 | 12/1987 | Powell et al. | 371/22.3 |
| 4,791,358 | 12/1988 | Sauerwald et al. | 371/22.3 X |
| 4,841,233 | 6/1989 | Yoshida | 371/21.4 X |
| 4,947,378 | 8/1990 | Jinbo et al. | 365/200 X |

OTHER PUBLICATIONS

McAdams, H. et al., "A1-Mbit CMOS Dynamic RAM With Design-For Test Functions", *IEEE Jour. of Solid-State Circuits*, vol. SC-21, No. 5, Oct. 1986, pp. 635-642.

Millman, J. et al., *Microelectronics*, McGraw-Hill, 1987, pp. 313-325.

*Primary Examiner*—Stephen M. Baker
*Attorney, Agent, or Firm*—Blakely, Sokoloff, Taylor & Zafman

[57] ABSTRACT

A test mode enable circuit in which a test mode code is written to one latch and a test mode enable code is written to a second latch. The test mode enable code is compared to preprogrammed values stored in the enable circuit. When the test mode enable code matches the preprogrammed value, a presence of a high voltage activates a test mode enable signal for entering the test mode. The latched test mode code is then used to perform the desired test. Additionally a pulsewidth detector is used as a filter to permit only high voltages of a minimum pulsewidth duration to activate the enable signal thereby preventing false triggering.

15 Claims, 3 Drawing Sheets

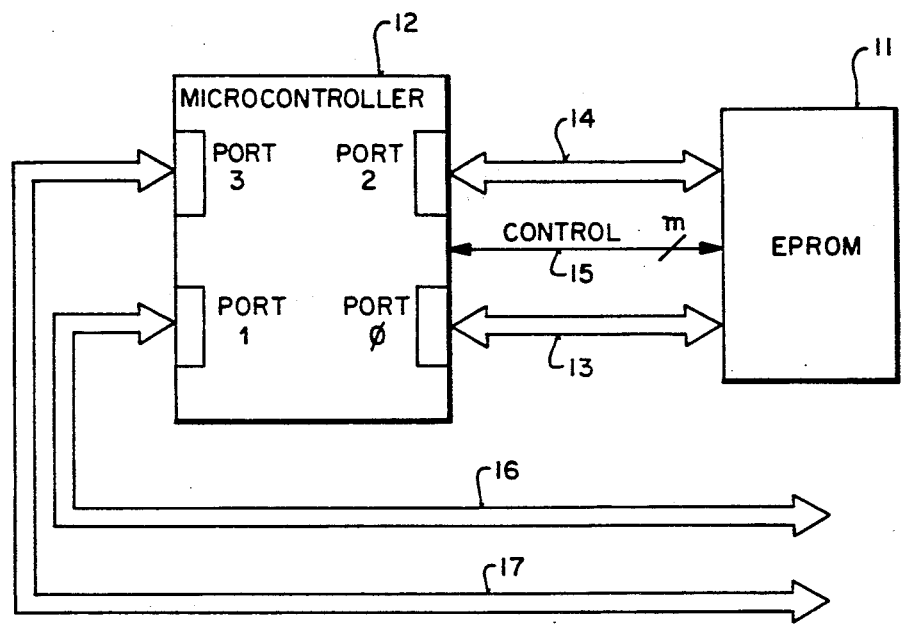
FIG_1 (PRIOR ART)
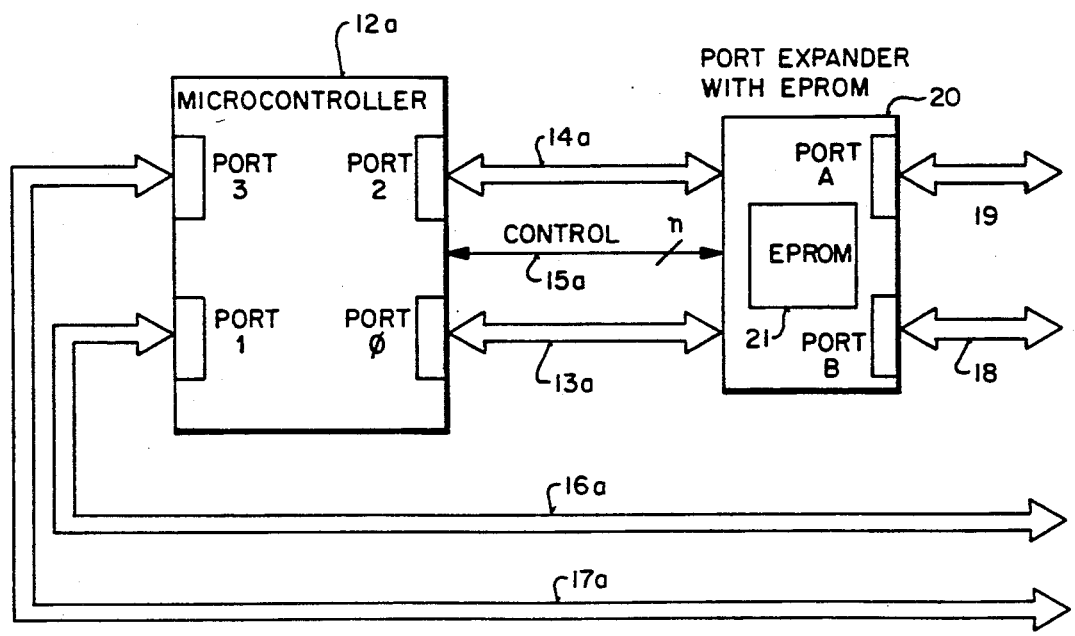
FIG_2

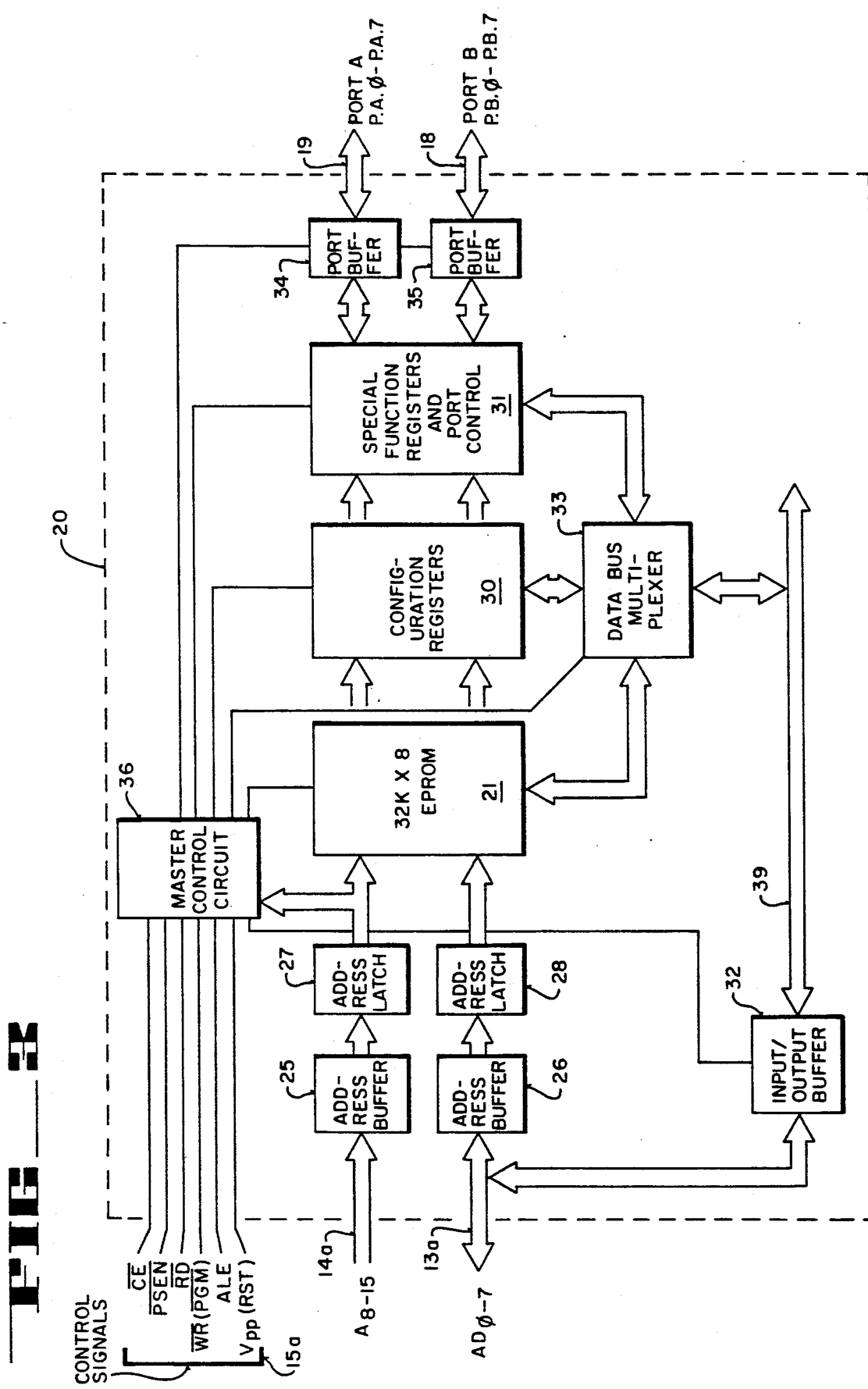

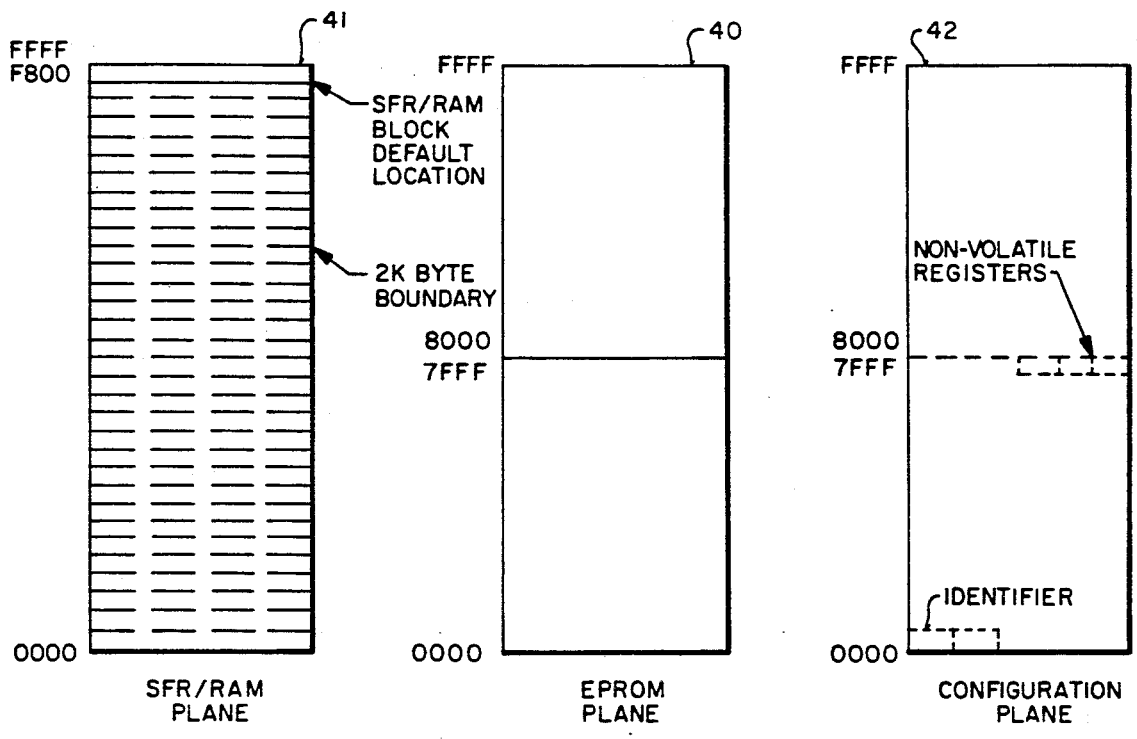
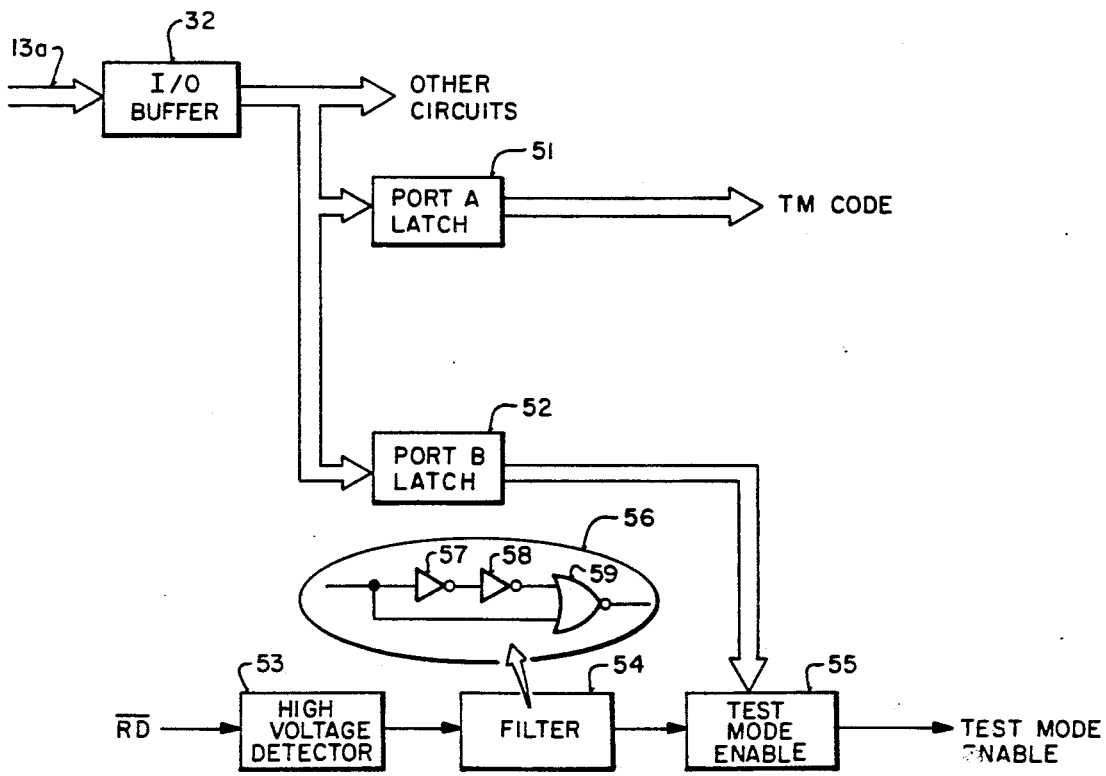

TEST MODE ENABLE SCHEME FOR MEMORY

This is a continuation of application Ser. No. 07/292,366 filed Dec. 30, 1988.

BACKGROUND OF THE INVENTION

1. Field of the Invention

The present invention relates to the field of memory devices and particularly to external memories configured with a microcontroller.

2. Related Application

This application is related to co-pending application Ser. No. 292,365, filed Dec. 30, 1988, and entitled "PORT EXPANDER ARCHITECTURE FOR EPROM", now abandoned.

3. Prior Art

In the area of semiconductor memories, the design and manufacture of erasable programmable read only memories (EPROM) are well-knwon in the prior art. These EPROM devices are formed on a semiconductor chip and typically configured as a standard size memory, such as 32K or 64K. Typically these memory chips are disposed in a standard package. Semiconductor memory devices, such as EPROMs, are coupled to operate in conjunction with other semiconductor devices. In most instances, these EPROMs are coupled to processors which control the transfer of data between it and the memory device. In a basic configuration, a certain memory location of the EPROM is accessed by the processor when the processor generates address signals on address lines coupled to the memory. Data is written or programmed into the memory or read from the memory depending on the control signals provided by the processor. The data transfer is achieved by placing the appropriate information on the data bus coupled to the memory. Unless the EPROM is part of a larger structure, such as a programmable logic array device, the EPROM does not include processing circuitry other than the circuitry needed for addressing and providing data transfer.

One group of processors used to operate with EPROMs are known as microcontrollers. A microcontroller is a specialized processor used to meet specific, including custom, application needs. These controllers are self contained units and typically can include a processor, logic circuits, timing and control circuits, buffers, latches, and on-chip memory or memories. In most instances, the specific application software is embedded in the controller chip. These controllers also include input/output (I/O) ports for the purpose of transferring information to and from the controller.

However, whenever external memory devices, such as an EPROM described above, are coupled to a given controller it is coupled to one or more of the ports of the controller. That is, if a given microcontroller requires an off-chip memory for a given function of the controller, then the off-chip memory is coupled to one or more of the ports of the controller, wherein these ports are lost for I/O use. Without the use of additional off-chip circuitry the coupling of the external memory to a microcontroller places severe limitation on its I/O capability, because the external memory monopolizes one or more of the microcontroller ports.

It is appreciated that what is required is a scheme for coupling external memory to a microcontroller without reducing the number of I/O ports of the controller.

SUMMARY OF THE INVENTION

The present invention describes a port expander for providing an external memory to be coupled to a microcontroller device but recapturing the use of those ports which are lost due to the coupling of the port expander to the microcontroller. In essence, the device expands the total number of ports from the microcontroller while coupling external memory to the microcontroller. The port expander of the present invention is manufactured in a single semiconductor device and does not require the use of specialized glue circuitry.

The port expander of the preferred embodiment is coupled to two ports of a microcontroller, each port being an 8-bit port. A 16-bit address signal and an 8-bit data signal are multiplexed on buses coupling the port expander to two ports of the microcontroller. The port expander includes a 32K byte EPROM, non-volatile configuration registers, and special function registers/port control unit to provide an external memory and port expansion capability to the microcontroller. The EPROM of the port expander provides the external memory to the microcontroller. However, when data transfer is to occur between an I/O device and the occupied port, data transfer between the I/O device and the occupied port occur via the expansion ports of the port expander. The port expander essentially operates as a data transfer point between the I/O device and the microcontroller. Therefore, data transfer can occur between the microcontroller and the EPROM of the port expander or between the microcontroller and an external devices via the port expander. The configuration registers provide a programmable set of registers for directing and addressing the EPROM or the special function register by the microcontroller.

The port expander of the present invention also includes a special test activation circuit that prevents accidental entering of a test mode. In order to enter a test mode, a valid test mode code must be written to one of the port latches coupled to the microcontroller. As a second condition, a valid test mode enable code must be written to the other port latch coupled to the microcontroller. Then a read signal having a voltage of approximately 12 volts must be present for a sufficient duration. When all three conditions are met, then the port expander enters its test mode. The time duration of the read signal is measured by a pulsewidth detector so that short pulses, such as glitches and noise pulses, do not inadvertently activate the test mode. By providing three necessary conditions which must be met, sufficient safeguards are provided to prevent accidentally entering the test mode.

BRIEF DESCRIPTION OF THE DRAWINGS

FIG. 1 is a prior art schematic showing the loss of two ports when an external memory is coupled to a microcontroller.

FIG. 2 is a schematic diagram showing the recapturing of ports which are lost when an external memory in a form of an EPROM residing within the port expander of the present invention is coupled to two of the ports of the microcontroller.

FIG. 3 is a block schematic diagram showing the port expander of the present invention.

FIG. 4 is an illustration showing three memory mapping planes available when using the port expander of the present invention.

FIG. 5 is a block schematic diagram showing the activation of a test mode of the port expander of the present invention.

DETAILED DESCRIPTION OF THE INVENTION

An apparatus for providing port expansion while also providing off-chip memory is described. In the following description, numerous specific details are set forth, such as specific memory size, signal lines, etc., in order to provide a thorough understanding of the present invention. It will be obvious, however, to one skilled in the art that the present invention may be practiced without these specific details. In other instances, well-known structures and processes have not been described in detail in order not to unnecessarily obscure the present invention.

Referring to FIG. 1, a prior art technique of coupling external memory to a microcontroller is shown. An EPROM 11 is shown as an external memory which is coupled to a microcontroller 12. Microcontroller 12 communicates to external devices through a plurality of ports wherein the specific example of FIG. 1 shows the microcontroller 12 having four ports, 0-3. Although a specific example is shown in FIG. 1, a variety of microcontroller devices with input/output (I/O) ports are well-known in the prior art. Specific examples of prior art microcontrollers include devices relating to the 8051, 8096, and 80188 microntroller families, which are manufactured by Intel Corporation of Santa Clara, Calif.

In the example of FIG. 1, two of the ports, port 0 and port 2, of microcontroller 12 are each coupled to the external memory, EPROM 11, by buses 13 and 14, respectively. Buses 13 and 14 are bi-directional buses for transferring information between EPROM 11 and bi-directional ports 0 and 2 of microcontroller 12. Various prior art schemes are known for coupling address and data signals onto buses 13 and 14. Further, it is to be noted that if a given bus 13 or 14 is used only to couple address information from the microcontroller 12 to EPROM 11, then it need not be a bi-directional bus. Additionally, control signals are coupled between microcontroller 12 and EPROM 11 on control lines 15.

In a typical operation, microcontroller 12 generates address signals which are coupled to EPROM 11 through either or both buses 13 and 14, for accessing address locations of EPROM 11. Then data is programmed into or read from EPROM 11 on either or both buses 13 and 14. It is to be appreciated that address and data signals can be multiplexed such that a given bus can couple both address and data signals.

The use of an external memory, such as EPROM 11, requires the dedication of two ports 0 and 2 in the example of FIG. 1. The microcontroller 12 is left with only ports 1 and 3 for its I/O communication. Buses 16 and 17 are coupled to ports 1 and 3 respectively, for providing the I/O data transfer. As is shown in FIG. 1, the utilization of two ports to couple an external memory to the four port microcontroller 12 leaves only two other ports 1 and 3 available to the microcontroller 12. To recover ports 0 and 2, specialized "glue" circuitry is needed to provide the necessary coupling of both I/O and EPROM 11 to ports 0 and 2.

Referring to FIG. 2, a port expander 20 of the present invention is shown coupled to the four port microcontroller 12a which is equivalent to the microcontroller 12 of FIG. 1. Port expander 20 includes an EPROM 21, which EPROM 21 is equivalent to EPROM 11 of FIG. 1. Port expander 20 is coupled to microcontroller 12a by buses 13a and 14a through ports 0 and 2, respectively. Control signals are coupled between microcontroller 12a and port expander 20 on control lines 15a. Ports 1 and 3 are coupled to various I/O devices by buses 16a and 17a, respectively. A letter "a" has been added to the prior art reference numerals of FIG. 1 to show that like reference numerals refer to the same parts throughout these several views but the suffix "a" relates to the present invention.

Address and data information are provided from ports 0 and 2 of microcontroller 12a and EPROM 21 is accessed equivalently to the description of FIG. 1. In addition to EPROM 21, port expander 20 includes its own ports, port "A" and port "B". A purpose for having ports "A" and "B" is to recapture the use of port 0 and 2 for I/O application when an external memory 21 is coupled to ports 0 and 2. In order to achieve this, port expander 20 of the present invention receives signals from ports 0 and 2 and selects the destination of these signals.

When data transfer is to occur between ports 0 and 2 of microcontroller 12a and external memory in the form of EPROM 21, port expander 20 causes signals on buses 13a and 14a to be directed to or from EPROM 21. However, if ports 0 and 2 are to be utilized for I/O applications, then signals on buses 13a and 14a are coupled to the two ports "B" and "A" of port expander 20. Buses 18 and 19 which are coupled to ports "B" and "A" respectively, allow for data transfer between I/O devices and ports "B" and "A". By selecting either EPROM 21 or ports "B" and "A" to be operative with buses 13a and 14a, ports 0 and 2 of microcontroller 12a can access an external memory, in the form of EPROM 21, or an I/O device through ports "B" and "A". Therefore, the port expander of the present invention restores ports which are lost when an external memory is coupled to those same ports of the microcontroller.

Referring to FIG. 3, the port expander 20 of the present invention is shown in more detail. Port 2 of microcontroller 12a is coupled to port expander 20 through bus 14a to address buffer 25, which is then coupled to address latch 27. Port 0 of microcontroller 12a is coupled to port expander 20 through bus 13a to address buffer 26, which is then coupled to address latch 28. The outputs of the address latches 27 and 28 are coupled together to either EPROM 21, configuration registers 30 or special function registers/port control (SFR/PC) unit 31.

Although various addressing and data transfer schemes can be used, the preferred embodiment utilizes the below described scheme, primarily to adapt to the earlier mentioned microcontrollers. During a first time period, address bits $A_{0-7}$ are provided on bus 13a and address bits $A_{8-15}$ are provided on bus 14a from microcontroller 12a. The sixteen address bits are then provided to address latches 27 and 28 for output from these latches. During a second time period, data bits $D_{0-7}$ are provided on bus 13a and is coupled to an internal bi-directional data bus 39 through I/O buffer 32. Data bus 39 is coupled to a data bus multiplexer 33 which selects one of the units 21, 30 or 31 to be coupled to bus 39 for effecting a data transfer. The output of address latch 27, besides being coupled to EPROM 21, is also coupled to master control circuit 36. A portion of the address signal $A_{8-15}$ is compared with preprogrammed bits in the configuration registers 30 in order to determine whether access is to unit 21, 30 or 31. In the preferred embodiment, the five most significant bits are used, although such number of bits is a design choice. Additionally, control signals are also coupled on lines 15a to master control circuit 36 from microcontroller 12a. Master control circuit 36 provides control signals to address latches 27 and 28, I/O buffer 32, EPROM 21, configuration registers 30, unit 31, multiplexer 33 and port buffers 34 and 35. Port buffers 34 and 35 are coupled to ports "A" and "B", respectively, which are then coupled to bi-directional buses 19 and 18. The port buffers 34 and 35 are also coupled bi-directionally to SFR/PC unit 31 for transfer of data between unit 31 and ports "A" and "B". It is also to be noted that other well-known circuits, such as latches coupled to I/O buffer 32 and port buffers 34 and 35 for latching signals, are not shown, but such circuits are well known.

Although a variety of control signals can be used, a representative sample of control signals used by port expander 20 of the preferred embodiment is shown in FIG. 3. A chip enable signal CE/ (/ is hereinafter used to designate a low activated condition) provides for a master device enable when asserted. When CE/ is not asserted, port expander 20 is in a standby condition and cannot be accessed. However, the ports will maintain their current active states. RD/ is used to designate a read condition from the SFR/PC unit 31. WR/ (PGM/) is used to write to or program the port expander 20. ALE signal is used to allow the address to flow through the latches 27 and 28. The $V_{PP}$(RST) provides programming supply voltage during programming and reset during other modes. The program store enable signal PSEN/ is used to designate a read condition from the EPROM 21 or configuration registers 30 and is used in certain conditions in conjunction with the RD/ signal to provide a read operation of port expander 20.

In operation, the port expander 20 of the preferred embodiment provides for three memory planes to be accessed by the sixteen bit address signal coupled from the associated microcontroller 12a. The memory mapping is actually performed by the microcontroller 12a for selecting the appropriate mapped unit 21, 30 or 31 of device 20. The three memory planes correspond to EPROM 21, configuration registers 30 and SFR/PC unit 31. The three mapped planes are shown in FIG. 4. The three memory planes are comprised of EPROM plane 40, SFR/RAM plane 41 and the configuration plane 42. When SFR/RAM plane is selected, the SFR/PC unit instructions can occupy one 2K byte block within the plane. In the preferred embodiment only five bytes are actually used for the SFR/PC unit instruction. The Unused portions can be relegated for RAM use. The other address locations are available for accessing RAM which is either resident on the microcontroller 12a or provided externally. In FIG. 4, the address locations are shown in hexidecimal format. Further, an identifier is used in the configuration plane at address 0000 to provide information pertaining to the device 20, such information as manufacturer, product type, etc.

In the normal operating mode, the configuration plane 42 cannot be accessed. Only the EPROM plane 40 and the SFR/RAM plane 41 are capable of being accessed. However, during the programming/verification mode, the EPROM and the configuration planes 40 and 42 are accessible. The EPROM 21 of the preferred embodiment is a 32K×8 byte device. Because the 16 bit address can access 64K bytes, the 32K byte EPROM 21 of the preferred embodiment can be mapped at various locations of the EPROM plane 40. One of the configuration registers 30, shown as a non-volatile register, provides the beginning address for mapping EPROM 21 within plane 40. The default location is shown to reside within the lower half of the EPROM plane 40, deisgnated by addresses 0000-7FFF. It is to be noted that the EPROM plane 40 can map two 32K byte EPROMs.

In the preferred embodiment, the special function registers (SFRs) resides within a 2K byte location of the SFR/RAM plane 41, the default location being the upper 2K bytes of the SFR/RAM plane. Another of the configuration registers 30 determines the location of the 2K byte SFR block. The ports "A" and "B" of port expander 20 are accessed by reading or writing to the SFRs. SFR/PC unit 31 controls the transfer of information between it and ports "A" and "B", according to the SFR.

Initially, when the port expander 20 of the present invention is coupled to a microcontroller 12a, the configuration registers 30 are programmed to configure the operation of port expander 20. In the preferred embodiment, three non-volatile registers comprise the configuration registers 30. The first register is used to provide the base address for mapping the 32K byte EPROM 21 within plane 40, the default position being at address location 0000. In the preferred embodiment, this first register is also used to combine the EPROM plane and the SFR/RAM plane by internally combining the PSEN/ and RD/signals. The second configuration register is used to provide the base address for the special function register. As stated above, the preferred embodiment uses a 2K byte boundary, such that the SFR can be located on any 2K byte boundary of the SFR/RAM plane 41. The default is at address F800. The third configuration register is used to configure each of the ports "A" and "B" for either transistor-transistor-logic (TTL) or complementary metal-oxide semiconductor (CMOS) compatible level I/O capabilities. Further, this third register also allows the polarity of RST to be complemented to provide a programmable reset.

Once the configuration registers have been programmed, the address which will access EPROM 21 and the special function registers 31 will have been programmed. When the microcontroller 12a desires to access EPROM 21, the address signals from the microcontroller 12a must correspond to the mapped address. For example, if the EPROM 21 is in its default location, than addresses of 0000-7FFF will be capable of accessing the EPROM 21. Alternatively, if ports "A" and/or "B" are to provide the data transfer, then the microcontroller 12a will provide addresses corresponding to the SFR in the SFR/RAM plane 41, which if in the default location resides between F800-FFFF. Data transfer between the microcontroller 12a and ports "A" and/or "B" are achieved by accessing the SFR location and storing the data in the SFR. The ports are bidirectional and can be read as well as written to.

The other address locations of the SFR/RAM plane 41 are used to address the RAM locations of the microcontroller 12a or other memory mapped devices. Therefore, the port expander 20 of the present invention is capable of providing an external EPROM memory to an associated microcontroller, yet at the same time special function registers allow for data transfer between the microcontroller and the two expanded ports "A" and "B". The configuration registers 30 are programmed such that the special function registers and the EPROM 21 can be mapped at various locations. This programmed mapping technique allows for greater flexibility in addressing EPROM 21 and expanded ports "A" and "B".

It is to be appreciated that although one mapping technique has been described with the preferred embodiment, various mapping techniques are available to access EPROM 21 and SFR31. For example, overlapping techniques can be used such that SFR registers can be mapped in the unused portion of the EPROM plane or the EPROM and SFR registers can be overlaid. Further, it is to be appreciated that with the four port microcontroller system shown in FIG. 2, a second port expander can be coupled to buses 13a and 14a such that ports 0 and 2 operate with a second port expander thus expanding ports 0 and 2 to form ports while accessing 64K bytes of EPROM. In such instances, the two mapping schemes can be combined such that the second EPROM can be mapped for access by address signals between addresses 8000-FFFF of FIG. 4. The use of a 32K byte EPROM readily allows two such EPROMs to be accessed in a 16-bit addressing scheme.

It is to be appreciated that the various mapping schemes are presented for an illustrative purpose and not for the purpose of limiting the present invention. Various other schemes can be readily implemented without departing from the spirit and scope of the present invention. Further, other units can be readily added or used in place of existing units, such as using a static RAM for EPROM 21, without departing from the spirit and scope of the invention. Also, although the preferred embodiment is shown having specific EPROM byte capacity, specific number of bits for address and data lines, such examples are for illustrative purpose only and that the actual size or numbers is a design choice.

TEST MODE ENABLE

Test modes are non-user modes which are typically used only for stressing the part or determining the margin of a part. Because test modes are used strictly to test a given part after it is manufactured, care must be taken to ensure that such test modes are not entered into by the user of the part. Such accidental or even intentional use of the part in its test mode can cause damage to associated devices. Some test mode enable schemes utilize a high voltage detector or detectors to place the part into a particular test mode. In some instances a noisy system condition can accidentally place a device into a test mode, thereby damaging itself or associated devices, or possibly causing incorrect information to be read or programmed.

In order to prevent accidental activation of the test mode, the port expander 20 of the present invention utilizes special circuitry to prevent such accidental activation. A special test activation circuit resides within port expander 20 for generating a test mode enable signal to enable the test mode. Referring to FIG. 5, two port latches 51 and 52 are coupled to accept the output of I/O buffer 32. The output of latch 52 is coupled to a test mode enable circuit 55, while latch 51 is coupled to various circuits which require a test mode code for performing a particular test. The read signal RD/ is coupled as an input to a high voltage detector circuit 53. The high voltage detector circuit 53 detects the presence of the necessary high voltage needed for entering the test mode. A high voltage detect signal is then coupled through a filter 54 and the filtered output is coupled as an input to the test mode enable circuit 55.

In operation, three conditions must exist before the port expander 20 of the preferred embodiment enters its test mode. First, a proper test mode (TM) code must be written into latch 51 for performing a particular test. Second, a test mode enable (TME) code must be written into the other latch 52. The input to the port latches 51 and 52 are provided by a microcontroller or other signal generating devices (for test purposes) on buses 14a and 13a. In the preferred embodiment latches 51 and 52 are derived from latches for ports A and B, respectively. However, it is to be appreciated that latches 51 and 52 need not be limited to the use of port latches. The test mode enable circuit 55 is pre-programmed with a stored value for comparison with the TME code such that it is activated only when the appropriate TME code is provided by latch 52.

The third requirement is the presence of high voltage to the high voltage detector circuit 53. High voltage is present when the RD/signal goes to a high voltage state, such as a voltage higher than the supply voltage VCC. In the preferred embodiment, 12 VDC is used. When RD/ is at 12 volts, it causes the high voltage detector circuit 53 to generate the detect signal. This signal from high voltage detector circuit 53 is coupled through filter 54 to the test mode enable circuit 55. Whenever the test mode enable circuit 55 receives the high voltage detect signal and the proper TME code is present it generates a test mode enable signal for enabling the test mode.

The filter circuit 54 includes a pulsewidth detector 56 comprised of a string of inverters (only two inverters 57 and 58 are shown in FIG. 5) coupled in series and NAND gate 59. NAND gate 59 has as its inputs the input to the first inverter 57 and the output of the last inverter 58. The pulsewidth detector 56 operates to remove short pulses, such as glitches, so that inadvertent high voltage generation cannot occur. That is, if for some reason the signal RD/ goes above VCC due to a voltage spike or if VCC glitches low, thereby generating the high voltage detect signal from high voltage circuit 53, this short duration signal cannot be coupled through filter 54, due to the pulsewidth detector 56 which operate to inhibit the passage of pulses of less than a predetermined pulsewidth. The minimum pulsewidth which can be coupled through detector 56 is determined by the delays within the serial string of inverters. The pulsewidth duration of the signal being coupled through detector 56 must be of sufficient length such that the pulse is still present at the input to inverter 57 after encountering the delays of the string of inverters, exemplified by inverters 57 and 58.

Therefore, in order to enter the test mode to perform a proper test, three conditions must exist. The port expander 20 must receive a valid test mode code for performing a particular test, receive a valid test mode enable code which matches the preprogrammed code, and have its read signal at a value of 12 volts for a sufficient duration. Only when all three of these conditions are present can the device perform the proper test. In an alternative embodiment, the test mode enable signal from circuit 55 can also be used to latch in the TM code to latch 51. That is, latch 51 cannot receive the TM code until test mode enable signal is generated.

It is to be appreciated that although the test mode enable scheme of the present invention is described in reference to the port expander, the test mode enable scheme can be readily implemented in other devices. For example, a memory device, such as an EPROM or a static RAM, can be made to enter its test mode by requiring valid codes to be written to its latches, and then causing a control signal, such as a read signal, to transition to a predetermined level for a sufficient period of time. Only when all three of these conditions occur, will the device perform its desired test. Further, other devices can be used instead of latches to perform the "latch-enable" scheme of the present invention.

Thus, a port expander which includes its own internal memory and having a special protection circuit to inhibit accidental triggering of the test mode is described. The port expander is coupled to operate with an associated processor, such as a microcontroller, by providing external memory to the associated device, but also recapturing the use of ports which are lost due to the coupling of the external memory. No additional glue circuits are required. The port expander of the represent invention is manufactured in a single semiconductor device, although such a requirement is not essential to the practice of the present invention.

We claim:

1. A test mode enable circuit for generating a test enable signal, said test mode enable circuit operating with a supply voltage having a first voltage level, comprising:
   a first latch for receiving a test mode code;
   a second latch for receiving a test mode enable code generated from a first source;
   a voltage detector for detecting a test activation voltage generated from a second source different than said first source, said test activation voltage having a second voltage level above the first voltage level; and
   an enable circuit coupled to said voltage detector and to said second latch, wherein said test mode enable code is compared to a programmed value stored in said enable circuit, such that if said test mode enable code matches said value and said test activation voltage is present, then said enable circuit generates an enable signal for performing a test determined by said test mode code.

2. The test mode enable circuit of claim 1 further including a pulsewidth detector coupled to said enable circuit and to said voltage detector for causing said enable signal to be generated only when said test activation voltage is of a predetermined duration.

3. A test mode enable circuit for generating a test enable signal to place a semiconductor device into a test mode to perform a given test, said test mode enable circuit operating with a supply voltage having a first voltage level, comprising:
   a first latch for receiving a test mode code;
   a second latch for receiving a test mode enable code generated from a first source;
   a voltage detector for detecting a test activation voltage generated from a second source different than said first source, said test activation voltage having a second voltage above the first voltage level, said voltage detector generating a test activation signal;
   a filter coupled to said voltage detector for filtering said test activation signal received from said voltage detector; and
   an enable circuit coupled to said filter and to said second latch, wherein said test mode enable code is compared to a preprogrammed value stored in said enable circuit, such that if test mode enable code matches said preprogrammed value and said test activation voltage is present, then said enable circuit generates an enable signal for performing a test determined by test mode code.

4. The test mode enable circuit of claim 3 wherein said device is an EPROM.

5. The test mode enable circuit of claim 3 wherein said device is a static RAM.

6. The test mode enable circuit of claim 3 wherein said device is a port expander.

7. The test mode enable circuit of claim 3 wherein said filter is a pulsewidth detector which allows test activation signal having a minimum predetermined pulsewidth to be passed through said filter, duration of said test activation signal corresponding to duration of said test activation voltage.

8. The test mode enable circuit of claim 7 wherein said pulsewidth detector is comprised of a plurality of buffers coupled serially and wherein an input to a first stage of said serially coupled buffers and an output from a last stage of said buffers are coupled as separate inputs to a gate, such that delay caused by said buffers determines said minimum pulsewidth.

9. The test mode enable circuit of claim 8 wherein said device is an EPROM.

10. The test mode enable circuit of claim 8 wherein said device is a static RAM.

11. The test mode enable circuit of claim 8 wherein said device is a port expander.

12. A test mode enable circuit for generating a test enable signal to place a semiconductor device into a test mode to perform a given test, said test mode enable circuit operating with a supply voltage having a first voltage level, comprising:
   a first latch for receiving a test mode code;
   a second latch for receiving a test mode enable code;
   a voltage detector for detecting a test activation, said test activation voltage having a second voltage level above the first voltage level, said voltage detector generating a test activation signal;
   a filter coupled to said voltage detector for filtering said test activation signal received from said voltage detector; and
   an enable circuit coupled to said filter and to said second latch, wherein said test mode enable code is compared to a preprogrammed value stored in said enable circuit, such that if said test mode enable code matches said preprogrammed value and said test activation voltage is present, then said enable circuit generates an enable signal for performing a test determined by said test mode code.

13. The test mode enable circuit of claim 12 wherein said filter is a pulsewidth detector which allows test activation signal having a minimum predetermined pulsewidth to be passed through said filter, duration of said test activation signal corresponding to duration of said test activation voltage.

14. The test mode enable circuit of claim 13 wherein said pulsewidth detector is comprised of a plurality of buffers coupled serially and wherein an input to a first stage of said serially coupled buffers and an output from a last stage of said buffers are coupled as separate inputs to a gate, such that delay caused by said buffers determines said minimum pulsewidth.

15. The test mode enable circuit of claim 14 wherein said device is an EPROM.

* * * * *